United States Patent
Klemm et al.

(10) Patent No.: US 11,255,909 B2
(45) Date of Patent: Feb. 22, 2022

(54) METHOD FOR SYNCHRONIZING A CHECKING APPARATUS, AND A CHECKING APPARATUS AND A COMPOSITE SYSTEM COMPRISING AT LEAST TWO CHECKING APPARATUSES

(71) Applicant: DSPACE DIGITAL SIGNAL PROCESSING AND CONTROL ENGINEERING GMBH, Paderborn (DE)

(72) Inventors: Matthias Klemm, Paderborn (DE); Daniel Baldin, Paderborn (DE)

(73) Assignee: DSPACE DIGITAL SIGNAL PROCESSING AND CONTROL ENGINEERING GMBH, Paderborn (DE)

(*) Notice: Subject to any disclaimer, the term of this patent is extended or adjusted under 35 U.S.C. 154(b) by 431 days.

(21) Appl. No.: 16/229,696

(22) Filed: Dec. 21, 2018

(65) Prior Publication Data
US 2019/0146035 A1 May 16, 2019

Related U.S. Application Data

(63) Continuation of application No. PCT/EP2017/062970, filed on May 30, 2017, and a
(Continued)

(30) Foreign Application Priority Data

May 30, 2016 (DE) .......................... 102016006361.0
Jul. 1, 2016 (DE) .......................... 102016007966.5

(51) Int. Cl.
*G06F 11/00* (2006.01)
*G01R 31/3185* (2006.01)
(Continued)

(52) U.S. Cl.
CPC .............. *G01R 31/318594* (2013.01); *G01R 31/31922* (2013.01); *G05B 17/02* (2013.01);
(Continued)

(58) Field of Classification Search
CPC ...... G01R 31/318594; G01R 31/31922; G01R 31/31727; G01R 31/31712; G05B 17/02;
(Continued)

(56) References Cited

U.S. PATENT DOCUMENTS 9,369,270 B1    6/2016  Spijker
10,656,203 B1 * 5/2020  Kishore ........... G01R 31/31723
(Continued)

FOREIGN PATENT DOCUMENTS

DE          10127293 A1      12/2001
DE       102005039450 B4      4/2008
(Continued)

OTHER PUBLICATIONS

International Search Report for PCT/EP2017/060502, dated May 30, 2017.
(Continued)

*Primary Examiner* — Christine T. Tu
(74) *Attorney, Agent, or Firm* — Orrick, Herrington & Sutcliffe LLP; Joseph A. Calvaruso; Richard A. Martinelli (57) ABSTRACT

A method is disclosed for synchronizing a checking apparatus, in which the checking apparatus is configured for testing at least one first electronic closed-loop control unit. Further disclosed is a checking apparatus which is transferable to a synchronized state. Additionally disclosed is a composite system which includes at least two checking apparatuses. Also disclosed are a checking apparatus for testing at least one first closed-loop control unit, and a composite system including at least one checking apparatus and a further checking apparatus, the latter checking appa-
(Continued)

ratus being configured to have the same effect as the first checking apparatus.

13 Claims, 2 Drawing Sheets

Related U.S. Application Data continuation-in-part of application No. 16/205,765, filed on Nov. 30, 2018, now Pat. No. 11,169,208, which is a continuation of application No. PCT/EP2017/060502, filed on May 3, 2017.

(51) Int. Cl.
| | | |
|---|---|---|
| *G01R 31/319* | (2006.01) | |
| *G05B 23/02* | (2006.01) | |
| *G05B 17/02* | (2006.01) | |
| *G06F 9/52* | (2006.01) | |

(52) U.S. Cl.
CPC .............. *G05B 23/0243* (2013.01); *G05B 2219/23446* (2013.01); *G06F 9/52* (2013.01)

(58) Field of Classification Search
CPC ...... G05B 23/0243; G05B 2219/23446; G06F 9/52; G06F 1/08
See application file for complete search history.

(56) References Cited

U.S. PATENT DOCUMENTS

| | | |
|---|---|---|
| 2005/0200390 A1 | 9/2005 | Starr et al. |
| 2006/0067449 A1 | 3/2006 | Boehl et al. |
| 2006/0197607 A1 | 9/2006 | Castro et al. |
| 2007/0273410 A1 | 11/2007 | Miike |
| 2011/0196641 A1* | 8/2011 | Sawai ............... G06F 11/24 702/117 |
| 2014/0071982 A1 | 3/2014 | Chandhoke et al. |
| 2015/0198663 A1* | 7/2015 | Syed ................ G01R 31/3177 714/726 |
| 2019/0146035 A1* | 5/2019 | Klemm ............. G05B 17/02 702/58 |

FOREIGN PATENT DOCUMENTS

| | | |
|---|---|---|
| EP | 1638243 A2 | 3/2006 |
| KR | 100406863 B1 | 11/2003 |
| WO | WO 96/03679 A1 | 2/1996 |

OTHER PUBLICATIONS

International Search Report for PCT/EP2017/062970, dated Sep. 25, 2017.
German Search Report for German Patent Application No. 102016006361.0, Jul. 10, 2018.
Gehring et al, "A hardware in the loop test bench for the validation of complex ECU Networks", Jul. 7, 2002, pp. 1-19, XP055401072, SAE 2002 World Congress, Detroit, Michigan.
Orolia Group et al., PCI Express Time Code Processor, Technical Specifications for Model TSync-PCIe, Spectracom, Apr. 30, 2014.
Techsat GmbH, Data Sheet PDL Sync Portable Data Loader Synchronization Solution, TechSAT, mastering integration complexity, 2015 TechSAT GMbH / Rev-1000.
Dspace GmbH, Catalog 2015, pp. 1-596 (part I pp. 1-298; part II 299-596).

* cited by examiner

METHOD FOR SYNCHRONIZING A CHECKING APPARATUS, AND A CHECKING APPARATUS AND A COMPOSITE SYSTEM COMPRISING AT LEAST TWO CHECKING APPARATUSES

CROSS-REFERENCE TO RELATED APPLICATIONS

This application is a continuation application of International Patent Application No. PCT/EP2017/062970, filed on May 30, 2017, which claims priority to German Patent Application No. 102016007966.5, filed on Jul. 1, 2016, and further a continuation-in-part of U.S. patent application Ser. No. 16/205,765, filed Nov. 30, 2018 and entitled "Inspection Device," which is a continuation application of International Patent Application No. PCT/EP2017/060502, filed on May 3, 2017, which claims priority to German Patent Application No. 102016006361.0, filed on May 30, 2016, the contents of which are incorporated herein by reference in their entireties and for all purposes.

FIELD OF THE INVENTION

The present disclosure generally relates to a method for synchronizing a checking apparatus, a checking apparatus transferable to a synchronized state, a checking apparatus for testing at least one first closed-loop control unit, and a composite system comprising at least one checking apparatus and a further checking apparatus.

BACKGROUND OF THE INVENTION

Frequently, checking apparatuses comprise at least one first computation unit and one second computation unit that is physically separate from the first computation unit, the first computation unit having a first executable model code for calculating a first submodel of the controlled system model, and the second computation unit having a second executable model code for calculating a second submodel of the controlled system model.

A published product catalog "Catalog 2015/Embedded Success dSPACE", which is available as a printed catalog, is cited with the reference number "P1" in the text that follows and can be found on the internet at www.dspace.com/de/gmb/home/medien/product_info/catalog_co ntents.cfm. P1 discloses apparatuses for testing closed-loop control units. In particular P1, pages 296 to 331 and pages 496 to 515, describes apparatuses and parts thereof for the intended use mentioned. Networking of the apparatuses is realizeable, for example, by means of Ethernet interface cards, as in the aforementioned product catalog on pages 472 and 473, for example. Such apparatuses may be configured as what are known as "HIL simulators", the abbreviation "HIL" (hardware in the loop) referring to a closed loop.

As such, there is apparent interest in technologies which are applicable to checking apparatuses.

DETAILED DESCRIPTION

According to various embodiments, a checking apparatus can be synchronized. The checking apparatus can test at least one first closed-loop control unit, and can include a first computation unit which executes model code. The model code can provide a simulated controlled system signal for stimulating the closed-loop control unit, and can manipulate an actuator signal of the closed-loop control unit. By way of the functionality discussed herein, a first time difference can reflect the interval of time between a global starting time and a first local starting time, and the first time difference can be subsequently provided for further use in the noted checking apparatus, and/or for use in a further checking apparatus. Moreover, according to various embodiments a composite system can include at least a first checking apparatus, and a second checking apparatus configured to have the same effect as the first checking apparatus.

The closed-loop control units cited at the outset are often referred to as controllers, although in the realm of system theory the scope of functions of said closed-loop control units usually goes beyond the "pure" open-loop control function and comprises closed-loop control functions.

The first computation unit of the checking apparatus, which has at least one first microprocessor, is intended and configured to execute a first model code, which realizes at least some of the controlled system simulation, by means of the microprocessor.

The model code, together with the hardware of the checking apparatus, replicates the technical environment of an electronic device or of a more complex technical system at least in part. Using the model code, the checking apparatus provides simulated sensor signals for the closed-loop control unit, for example. In addition, the checking apparatus can be used as a controlled current sink for deriving an actuator current provided by the closed-loop control unit, for example.

What is known as HIL simulation is an international technical term, in particular also used in the German-speaking region, for a test method that involves an "embedded system", for example a closed-loop control unit or a mechatronic module, being connected by its inputs and outputs to an adapted counterpart, for example a checking apparatus in the form of an HIL simulator, that is used for replicating the real environment of the embedded system. During the test on the embedded system, at least some of the input signals for the embedded system are thus provided by the HIL simulator, and at least some of the output signals from the embedded system are sent to the HIL simulator.

By way of example, a model code of a controlled system model executed on an HIL simulator can be used to replicate the timing response of the environment of the system to be tested. If, for example, an HIL simulator is meant to test an embedded system, in particular a closed-loop control unit (often shortened to ECU: electronic closed-loop control unit), then the HIL simulator is configured as an at least partial replication of the real environment of the closed-loop control unit. In this case, the HIL simulator can thus use its inputs and outputs, or bidirectional communication channels, to communicate with the controller and can therefore act as an adapted counterpart of the closed-loop control unit.

HIL simulation usually needs to take place in real time. When the technically relevant environment of the closed-loop control unit is simulated, the simulated environment comprising the simulated controlled system, it is in particular possible for such interactions of the closed-loop control unit as can recur in a later real environment of the closed-loop control unit to be replicated in automated fashion and/or in a predefined order. This has the advantage that a new development version of a piece of open-loop or closed-loop control software can be tested under the same criteria as the predecessor version. It is therefore possible to verify in detail whether or not a fault has been rectified (retesting).

Tests on real systems (for example on a brake system or a traction control system of a motor vehicle) can be greatly reduced by means of tests on the HIL simulator, and it is additionally possible for system limits or limits of the controllability of the closed-loop control unit and/or of the controlled system to be ascertained without putting the real system and its users (e.g. automobile and driver) at risk.

HIL simulation is typically a simplification of reality and usually cannot fully replace the test on the real system that more often than not takes place later, for example the test on the interaction of the closed-loop control unit with the "real" controlled system of a controlled prototype and/or the test on the interaction of the closed-loop control unit with a controlled mass-produced product.

It is known practice to use a physically distributed checking apparatus for testing at least one electronic closed-loop control unit, the checking apparatus comprising at least two separate computation units—for example at least two separated and networked simulators. The 2002-published document—subsequently referenced by P2—"A Hardware-in-the-Loop Test Bench for the Validation of Complex ECU Networks", J. Gehring, H. Schütte, dSPACE GmbH, page 3, FIG. 3 of the 2002 document, publication reference "SAE 2002 World Congress Detroit, Mich. Mar. 4-7, 2002" already depicts a checking apparatus configured as a distributed HIL simulator and having multiple computation units, which in this case are configured as a "central unit", engine unit, that is to say "engine", power transmission unit, that is to say "transmission", and combined ESP suspension unit, that is to say "ESP suspension", for example. The computation units are networked to one another via an optical connecting means, that is to say a "high-speed optical link". Page 7, right-hand side, the "Conclusion" section, second list point in the same document, mentions that demands on interprocessor communication can require time-stamping and automatic process synchronization.

The document—subsequently referenced by P3—"Hardware-in-the-Loop Technology Enabling Flexible Testing Processes", Andreas Himmler, dSPACE GmbH, page 3, paragraph B., publication reference "51st AIAA Aerospace Sciences Meeting, 2013, Grapevine, Tex., USA" discloses the practice of providing a serial network called IOCNET®, which is based on the physical layer of Gigabit-Ethernet, for HIL simulators, which is able to be used by the interface cards provided for the input and output of signals and data, abbreviated to I/O cards, to interchange data both with one another and with the microprocessor card(s) in real time. For the data interchange between the I/O cards and/or processor cards, which are up to 100 meters apart, for example, it is possible to use what are known as Gigalink modules, as are shown on pages 355 and 361 of the aforementioned document P1, for example. The data transmission media proposed between the I/O cards and/or processor card(s), which are 100 meters apart, for example, in P3, page 3, paragraph B, and in P1, page 349, are a fiber optic cable connection, referred to here as "optical media" or "fiber-optic cable". The aforementioned network IOCNET provides a protocol that supports timing synchronization, in particular for reading in input signals on the interfaces of the I/O cards used; in this regard see document P1, page 299, together with the figure on the same page if applicable.

The aforementioned networking solutions by means of IOCNET® for timing synchronization within a checking apparatus—in particular an HIL simulator—for testing a closed-loop control unit are intended only for a distance between the computation units that only slightly exceeds 100 meters, however.

Closed-loop control units and the control software implemented therein are increasingly being developed in physically distributed work groups. These frequently involve multiple companies at different sites. The software and hardware developers involved therefore frequently require adapted, in particular in-situ-adaptable, checking apparatuses for testing for the purpose of testing the closed-loop control units in the progressive development phases.

There may therefore arise in future a demand for a checking apparatus for testing that, by way of example, comprises a network comprising two or more computation units—for example HIL simulators, these computation units or HIL simulators being at different sites, the sites possibly being at a distance from one another of significantly more than 100 meters.

In practical application, closed-loop control units are very frequently networked to further closed-loop control units. By way of example, motor vehicles having more than 40 closed-loop control units are not uncommon, some of the closed-loop control units being able to ensure the respectively associated scope of functions only when networked, depending on the application, this being immediately obvious from the example of the networking of an automatic gearbox closed-loop control unit to an engine closed-loop control unit.

Should a need arise to connect closed-loop control units at different sites to a distributed checking apparatus for testing, in particular to a checking apparatus consisting of multiple HIL simulators, which, by way of example, are several hundred meters or several kilometers away from one another, or could even be on different continents if applicable, then previous solutions for networking and synchronizing the computation units of the distributed checking apparatus would sometimes—depending on the distance of the computation units of the checking apparatus—fail, or severe disadvantages, in particular in regard to the accuracy of the temporal association of interactions between the closed-loop control units and the checking apparatus thereof for testing, would have to be accepted with the previous solutions for networking and synchronization.

A further problem of known checking apparatuses is that the electronic clock circuits thereof, for the most part abbreviated to "clocks", which are intended to provide a clock signal to further components of the checking apparatus, have a time drift.

Against this background, one object of the present invention is to specify a method for synchronizing a checking apparatus that develops the prior art;
and a second object of the present invention is
to specify a checking apparatus that develops the prior art;
and a third object of the present invention is
to specify a composite system comprising at least two checking apparatuses that develops the prior art.

With regard to the method, the object is achieved according to the invention by the features specified in claim 1;

with regard to the checking apparatus, the object is achieved according to the invention by the features specified in claim 7;

with regard to the composite system, the object is achieved according to the invention by the features specified in claim 10.

Advantageous configurations of the invention are the subject matter of dependent patent claims.

An advantage of the invention is that problems of the prior art that are cited at the outset are at least to some extent eliminated.

Figure 1:
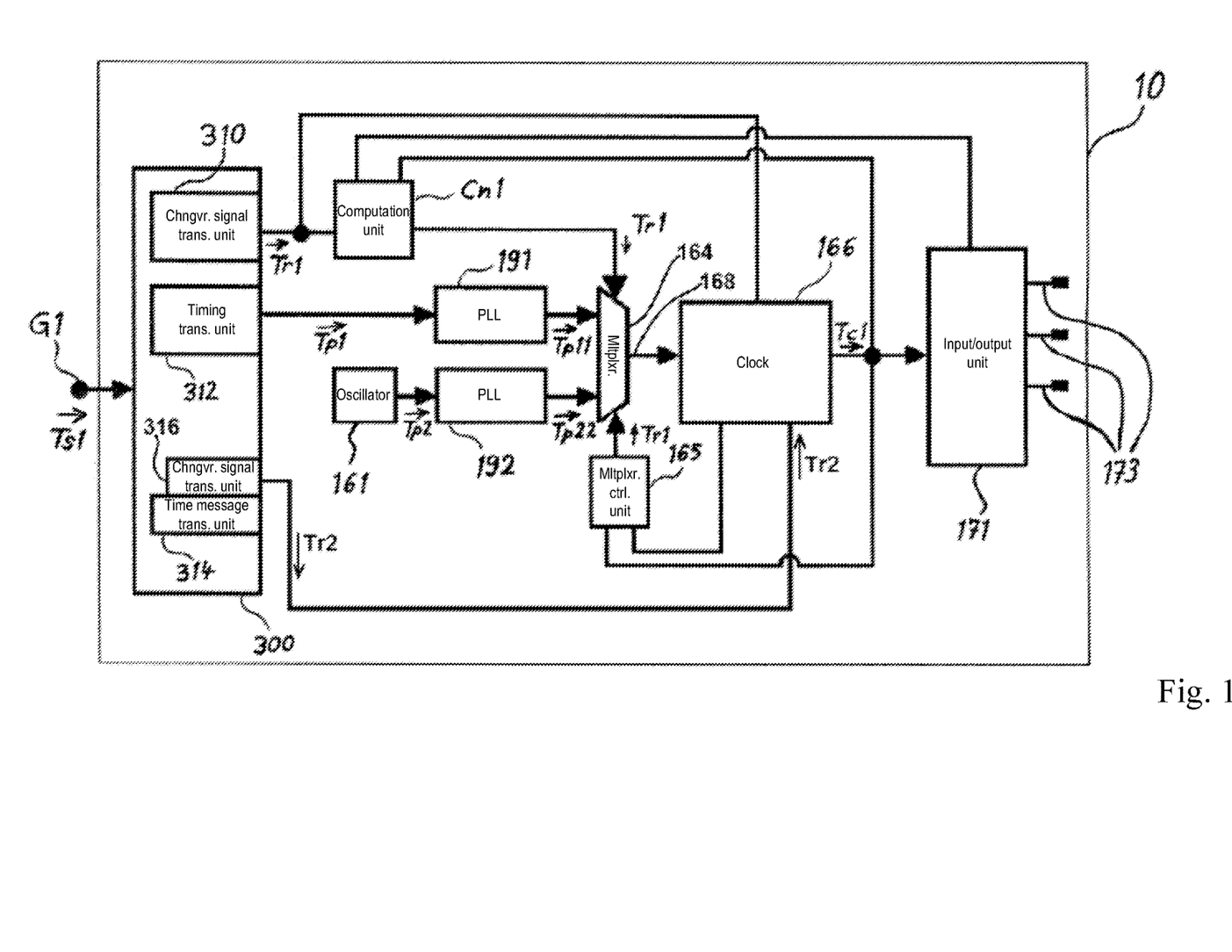
FIG. 1 illustrates a schematic view of an example checking apparatus, according to an embodiment of the present disclosure.

According to the invention, a method for synchronizing a checking apparatus 10 is proposed, wherein the checking apparatus 10 is configured for testing at least one first closed-loop control unit and the checking apparatus 10 comprises at least: a first computation unit Cn1 for executing a model code, the model code being able to be used to provide a simulated controlled system signal for stimulating the closed-loop control unit and to manipulate an actuator signal of the closed-loop control unit, and a first time signal converter unit 300 having at least (i) a first time signal interface G1 for picking up a first time signal Ts1 of a global time signal source associated with a global time scale, and (ii) a first changeover signal transmission unit 310 configured to provide a first changeover signal Tr1 for forwarding to a first multiplexer 164, and (iii) a first timing transmission unit 312 configured to generate a first periodic timing signal Tp1 from the first time signal Ts1 and to output the first periodic timing signal Tp1 to a first PLL 191, and wherein the checking device 10 furthermore comprises:

(a) a first oscillator 161 configured to generate a second periodic timing signal Tp2 and to output the second periodic timing signal Tp2 to a second PLL 192, and (b) a first clock 166, firstly connected to the first multiplexer 164 by means of a first timing signal line 168 and secondly configured to forward a first clock signal Tc1, referenced to a first local time scale CL1, to a first input/output unit 171 and/or the first computation unit Cn1, wherein a first multiplexer input of the first multiplexer 164 is connected to a first PLL output of the first PLL 191 to transmit a first frequency-stabilized timing signal Tp11 in the direction of the first multiplexer 164, and wherein a second multiplexer input of the first multiplexer 164 is connected to a second PLL output of the second PLL 192 to transmit a second frequency-stabilized timing signal Tp22 in the direction of the first multiplexer 164, and wherein the first changeover signal Tr1 is provided to be used to control the first multiplexer 164 such that depending on a state of the changeover signal Tr1 the first multiplexer 164 can be used to forward either the first frequency-stabilized timing signal Tp11 or the second frequency-stabilized timing signal Tp22 to the first clock 166, and wherein the first clock 166 is configured so as, depending on the state of the changeover signal Tr1, to process either the first frequency-stabilized timing signal Tp11 or the second frequency-stabilized timing signal Tp22 to generate the first clock signal Tc1, wherein the first changeover signal transmission unit 310 and a time message transmission unit 314 are used to perform a change of state of the first changeover signal Tr1 when a predefined first changeover time Tx1 stipulated by the time message transmission unit 314 is present, wherein the method furthermore involves the change of state of the first changeover signal Tr1 prompting, in a method step A, triggering of forwarding of the second frequency-stabilized timing signal Tp22 to the first clock 166 via the first timing signal line 168 being aborted at the first changeover time T1 by means of the first multiplexer 164, and forwarding of the first frequency-stabilized timing signal Tp11 to the first clock 166 via the first timing signal line 168 being effected at the first changeover time Tx1, and a method step B, which is at a later time than step A, being used to ascertain a first time difference T1D such that a predefined first global clock comparison time T1G, which follows the first changeover time T1 on the global time scale CG1, is selected as a minuend, and that a first local clock comparison time T1L, which is present at the same time as the first global clock comparison time T1G and is associated with the first local time scale CL1, is selected as a subtrahend, and the first time difference T1D reflects the interval of time between the global starting time TG0 and the first local starting time TL0, and the first time difference T1D is subsequently provided for further use in the checking apparatus 10 and/or for use in a further checking apparatus.

According to the invention, a checking apparatus 10 for testing at least one first closed-loop control unit is furthermore proposed, wherein the checking apparatus 10 comprises at least: a first computation unit Cn1 for executing a model code, the model code being able to be used to provide a simulated controlled system signal for stimulating the closed-loop control unit and to manipulate an actuator signal of the closed-loop control unit, and a first time signal converter unit 300 having at least (i) a first time signal interface G1 for picking up a first time signal Ts1 of a global time signal source associated with a global time scale, and (ii) a first changeover signal transmission unit 310 configured to provide a first changeover signal Tr1 for forwarding to a first multiplexer 164, and (iii) a first timing transmission unit 312 configured to generate a first periodic timing signal Tp1 from the first time signal Ts1 and to output the first periodic timing signal Tp1 to a first PLL 191, and wherein the checking device 10 furthermore comprises:

(a) a first oscillator 161 configured to generate a second periodic timing signal Tp2 and to output the second periodic timing signal Tp2 to a second PLL 192, and (b) a first clock 166, firstly connected to the first multiplexer 164 by means of a first timing signal line 168 and secondly configured to forward a first clock signal Tc1, referenced to a first local time scale CL1, to a first input/output unit 171 and/or the first computation unit Cn1, wherein a first multiplexer input of the first multiplexer 164 is connected to a first PLL output of the first PLL 191 to transmit a first frequency-stabilized timing signal Tp11 in the direction of the first multiplexer 164, and wherein a second multiplexer input of the first multiplexer 164 is connected to a second PLL output of the second PLL 192 to transmit a second frequency-stabilized timing signal Tp22 in the direction of the first multiplexer 164, and wherein the first changeover signal Tr1 is provided to be used to control the first multiplexer 164 such that depending on a state of the changeover signal Tr1 the first multiplexer 164 can be used to forward either the first frequency-stabilized timing signal Tp11 or the second frequency-stabilized timing signal Tp22 to the first clock 166, and wherein the first clock 166 is configured so as, depending on the state of the changeover signal Tr1, to process either the first frequency-stabilized timing signal Tp11 or the second frequency-stabilized timing signal Tp22 to generate the first clock signal Tc1, wherein the first changeover signal transmission unit 310 is configured to use a time message transmission unit 314 to perform a change of state of the first changeover signal Tr1 when a predefined first changeover time Tx1 stipulated by the time message transmission unit 314 is present, and wherein the checking apparatus 10 is furthermore configured to be prompted, in a method step A, by the change of state of the first changeover signal Tr1 to trigger forwarding of the second frequency-stabilized timing signal Tp22 to the first clock 166 via the first timing signal line 168 being aborted at the first changeover time Tx1 by means of the first multiplexer 164, and forwarding of the first frequency-stabilized timing signal Tp11 to the first clock 166 via the first timing signal line 168 being effected at the first changeover time Tx1, and wherein the checking apparatus 10 is furthermore configured to use a method step B, which is at a later time than step A, to ascertain a first time difference T1D such that a predefined first global clock comparison time T1G, which follows the first changeover time Tx1 on the global time scale CG1, is selected as a minuend, and that a first local clock comparison time T1L, which is present at the same time as the first global clock comparison time T1G and is associated with the first local time scale CL1, is selected as a subtrahend, and the first time difference T1D obtained from the minuend and the subtrahend reflects the interval of time between the global starting time TG0 and the first local starting time TL0, and the first time difference T1D is subsequently provided for further use in the checking apparatus 10 and/or for use in a further checking apparatus.

According to the invention, a composite system comprising at least one checking apparatus (10) as above and a further checking apparatus configured to have the same effect as the checking apparatus (10) is furthermore proposed, wherein the checking apparatus (10) and the further checking apparatus are connected via a data transmission means, and the checking apparatus 10 and the further checking apparatus are configured via the data transmission means to transmit data calculated by means of the first computation unit Cn1, and/or to transmit measurement data captured by means of input/output interfaces 173, and/or to transmit the first time difference T1D as above from the first checking apparatus to the further checking apparatus.

One of the advantages of the method according to the invention and the checking apparatus according to the invention and the composite system is that they allow the first computation unit and a second computation unit to be synchronized in a comparatively simple manner despite a distance of possibly several hundred meters or even many kilometers between the computation units. Advantageously, the invention can be used to synchronize the checking apparatus and a further checking apparatus with one another.

Unwanted sudden changes in the first clock signal, which "normally" changes in predefined time steps, are reducible or even entirely avoidable by means of the invention.

Where the term "synchronization" is used in this document, timing synchronization is always meant. What is known as angle synchronization is frequently based on timing synchronization. Angle synchronization is not the subject matter of the present invention, however.

The term PLL is a common technical term that was derived from the English language (PLL—"phase-locked loop") and has also been common in the German-speaking area for several years. Alternatively, the term PLL module is also used as a synonym for the term "PLL". The PLL or PLLs (plurality) can preferably be provided for frequency stabilization and/or for frequency matching. By way of example, in a preferred development of the checking apparatus 10, there is provision for the first PLL 191 disciplined by the first periodic timing signal Tp1 to be configured such that the Tp11 frequency of the first frequency-stabilized timing signal Tp11 and the Tp22 frequency of the second frequency—stabilized timing signal Tp22 are brought into line, should this still not be the case from the first changeover time Tx1 onward.

The invention is explained in more detail below with reference to the drawing. Here, parts and signals of the same type are labeled with identical designations. The depicted embodiments are highly schematized.

The depiction in FIG. 1 shows a schematic view of a first embodiment of the checking apparatus 10 according to the invention for testing a closed-loop control unit, the closed-loop control unit not being depicted in FIG. 1, but rather input/output interfaces 173 connected to appropriate interfaces of the closed-loop control unit while it is being checked.

In a preferred embodiment of the method according to the invention, the first time difference (T1D) ascertained in method step B and/or the first clock signal (Tc1) is/are transmitted to the first computation unit (Cn1) and/or to the first input/output unit (171).

In another embodiment of the method according to the invention, method step B is triggered by means of a second changeover signal (Tr2) that is output by a second changeover signal transmission unit (316).

In the latter embodiment, there is preferably provision for the second changeover signal (Tr2) to be sent to the first clock (166) and/or to the first computation unit (Cn1) at a predefined time that is stored in the time signal converter unit (300) and, chronologically, is firstly after the first changeover time (Tx1) and is secondly after a first transient time interval (Tosc) of the first PLL (191) has elapsed.

In another development of the method according to the invention, the checking apparatus (10) is connected to a further checking apparatus via data connection means, and the further checking apparatus is an identical equivalent of the checking apparatus.

In a particularly preferred development of the method according to the invention, the first time difference (T1D) is used in calculations of the first computation unit (Cn1) to (a) convert an arbitrary time, chronologically following the first global clock comparison time, on the global time scale (CG1) into an associated time of the first local time scale (CL1), or (b) convert an arbitrary time, chronologically following the first global clock comparison time, on the local time scale (CL1) into an associated time of the global time scale (CG1).

Preferably, the first computation unit Cn1 and/or the first input/output unit 171 is furthermore configured to link the first clock signal Tc1 to calculated data of the first computation unit Cn1 and/or to data that have been received via the input/output interfaces 173 of the first input/output unit 171.

The time message transmission unit 314 is preferably configured to transmit, in particular cyclically, a respective time message, that is to say digital data in each case comprising a coded present time statement referenced to a global time scale. The time message is preferably transmitted to the first computation unit Cn1 and/or to the first clock 166 and/or to an optionally providable multiplexer control unit 165.

The global time scale CG1 has a global starting time TG0 representing a predefined start, in particular stipulated for mathematical purposes, of a global time calculation of the global time signal source.

The first local time scale has a first local starting time TL0 representing a predefined start of a local time calculation of the first clock 166 of the checking apparatus 10.

In a preferred embodiment of the apparatus according to the invention, the global time source is a time signal source of a global navigation satellite system. In this instance, it is preferred if the global navigation satellite system is consistent with the Global Positioning System (GPS) or the GLONASS or GALLILEO or BEIDOU or GAGAN or IRNSS or QZSS navigation satellite system.

The global time source preferably comprises multiple satellites.

Additionally, it should be mentioned that the known global navigation satellite systems are primarily used for position determination and navigation on Earth and in the air, but the time signals of the global navigation satellite systems are usable for further applications, as outlined in the present document.

The best-known global navigation satellite systems include:

GPS, that is to say the "Global Positioning System" of the United States of America;

GLONASS, that is to say the "GLObal NAvigation Satellite System" of the Russian Federation;

Galileo of the European Union and

Beidou of the People's Republic of China.

Full development of Beidou and Galileo is expected in the next few years.

What is known as GPS time comes from the time system of the navigation satellites of the Global Positioning System. It is consistent—apart from a slight difference of a few seconds—with international atomic time, abbreviated to TAI. In comparison with Coordinated Universal Time, called UTC, GPS time likewise differs by a few seconds.

The useful data transmitted with GPS include the present difference between GPS time and UTC being transmitted in a data field provided specifically for that purpose. GPS receivers can automatically display or provide UTC time by subtracting the appropriate number of leap seconds. GPS receivers are therefore suitable for use in a time signal converter unit 300, because these make the first time signal Ts1 of the global GPS time signal source available for the checking apparatus for further use.

Preferably, the checking apparatus (10) according to the invention has a suitability for carrying out one of the developments or one of the embodiments of the method according to the invention.

In one development of the checking apparatus (10) according to the invention, the first computation unit (Cnl) and/or the first input/output unit (171) is configured to link the first clock signal (Tc1) to calculated data of the first computation unit (Cn1) and/or to data that have been received via the input/output interfaces (173) of the first input/output unit (171).

Figure 2:
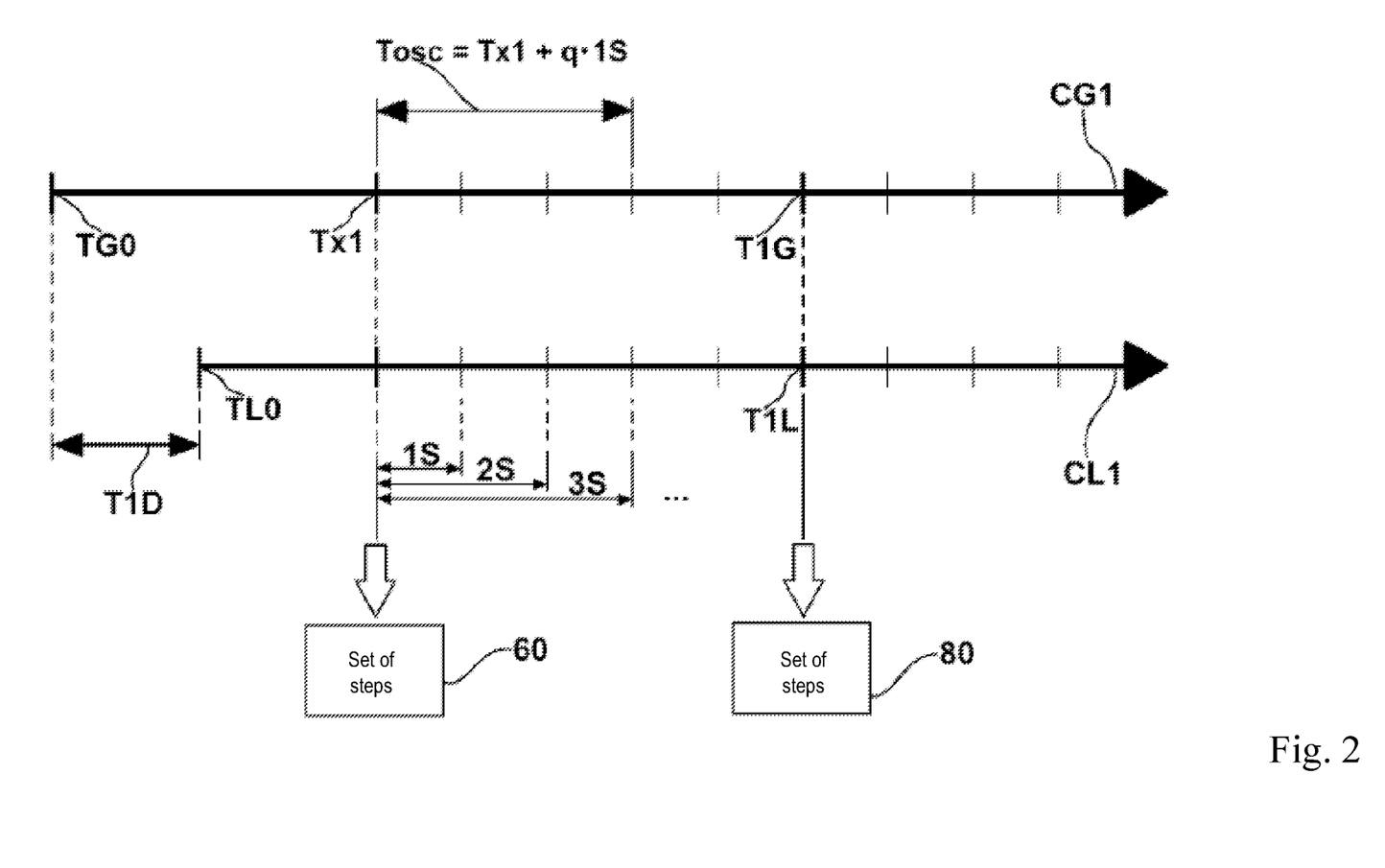
FIG. 2 illustrates a comparison between a global time scale and a local time scale, according to an embodiment of the present disclosure.

FIG. 2 serves to further illustrate the invention or the developments or configurations of the invention.

An exemplary embodiment depicted in FIG. 2 is used to schematically compare the global time scale CG1 present in the exemplary embodiment and the first local time scale CL1 that is present. It can be seen in particular that a first set 60 of method steps according to the applicable method features is triggered at the first changeover time Tx1 and a second set 80 of method steps according to the applicable method features is triggered at the first global clock comparison time T1G.

Preferably, substantially identical timing of all clocks in the composite system exists from the first changeover time Tx1 onward.

Advantageously, the invention in particular allows inexpensive means to be used to link one or more checking apparatus(es) or the clock(s) thereof to the global time scale and therefore to synchronize them.

The invention claimed is:

1. A method for synchronizing a checking apparatus, wherein the checking apparatus is configured for testing at least one first closed-loop control unit, comprising:

executing, by a first computation unit, a model code, the model code being able to be used to provide a simulated controlled system signal for stimulating the closed-loop control unit and to manipulate an actuator signal of the closed-loop control unit;

picking up, by a first time signal interface of a first time signal converter unit, a first time signal of a global time signal source associated with a global time scale;

providing, by a first changeover signal transmission unit of the first time signal converter unit, a first changeover signal for forwarding to a first multiplexer;

generating, by a first timing transmission unit of the first time signal converter unit, a first periodic timing signal from the first time signal;

outputting, by the first timing transmission unit of the first time signal converter unit, the first periodic timing signal to a first PLL;

generating, by a first oscillator, a second periodic timing signal;

outputting, by the first oscillator, the second periodic timing signal to a second PLL; and forwarding, by a first clock connected to the first multiplexer by means of a first timing signal line, a first clock signal, referenced to a first local time scale, to a first input/output unit and/or the first computation unit, wherein a first multiplexer input of the first multiplexer is connected to a first PLL output of the first PLL to transmit a first frequency stabilized timing signal in the direction of the first multiplexer, wherein a second multiplexer input of the first multiplexer is connected to a second PLL output of the second PLL to transmit a second frequency stabilized timing signal in the direction of the first multiplexer, wherein the first changeover signal is provided to be used to control the first multiplexer such that depending on a state of the changeover signal the first multiplexer can be used to forward either the first frequency stabilized timing signal or the second frequency stabilized timing signal to the first clock, wherein the first clock, depending on the state of the changeover signal, processes either the first frequency stabilized timing signal or the second frequency stabilized timing signal to generate the first clock signal, wherein the first changeover signal transmission unit and a time message transmission unit are used to perform a change of state of the first changeover signal when a predefined first changeover time stipulated by the time message transmission unit is present, wherein the change of state of the first changeover signal prompts triggering of:

forwarding of the second frequency-stabilized timing signal to the first clock via the first timing signal line being aborted at the first changeover time by means of the first multiplexer, and forwarding of the first frequency-stabilized timing signal to the first clock via the first timing signal line being effected at the first changeover time, and wherein, at a later time than the first changeover time, a first time difference is ascertained such that:

a predefined first global clock comparison time, which follows the first changeover time on the global time scale, is selected as a minuend, a first local clock comparison time, which is present at the same time as the first global clock comparison time and is associated with the first local time scale, is selected as a subtrahend, the first time difference reflects the interval of time between the global starting time and the first local starting time, and the first time difference is subsequently provided for further use in the checking apparatus and/or for use in a further checking apparatus.

2. The method as claimed in claim 1, wherein:
said ascertained first time difference, and/or
the first clock signal, is/are transmitted to the first computation unit and/or to the first input/output unit.

3. The method as claimed in claim 1, wherein said ascertaining of the first time difference is triggered by a second changeover signal output by a second changeover signal transmission unit.

4. The method as claimed in claim 3, wherein the second changeover signal is sent to the first clock and/or to the first computation unit at a predefined time that is stored in the time signal converter unit, and wherein said predefined time is chronologically:
firstly after the first changeover time, and
secondly after a first transient time interval of the first PLL has elapsed.

5. The method as claimed in claim 1, wherein the checking apparatus is connected to said further checking apparatus via data connection means, and wherein the further checking apparatus is an identical equivalent of the checking apparatus.

6. The method as claimed in claim 1, wherein the first time difference is used in calculations of the first computation unit to:
convert an arbitrary time, chronologically following the first global clock comparison time, on the global time scale into an associated time of the first local time scale, or
convert an arbitrary time, chronologically following the first global clock comparison time, on the local time scale into an associated time of the global time scale.

7. A checking apparatus for testing at least one first closed-loop control unit, wherein the checking apparatus comprises:
a first computation unit for executing a model code, the model code being able to be used to provide a simulated controlled system signal for stimulating the closed-loop control unit and to manipulate an actuator signal of the closed-loop control unit;
a first time signal converter unit, wherein the first time signal converter unit comprises:
a first time signal interface for picking up a first time signal of a global time signal source associated with a global time scale;
a first changeover signal transmission unit configured to provide a first changeover signal for forwarding to a first multiplexer; and
a first timing transmission unit configured to generate a first periodic timing signal from the first time signal and to output the first periodic timing signal to a first PLL;
a first oscillator configured to generate a second periodic timing signal and to output the second periodic timing signal to a second PLL; and
a first clock, firstly connected to the first multiplexer by means of a first timing signal line and secondly configured to forward a first clock signal, referenced to a first local time scale, to a first input/output unit and/or the first computation unit,
wherein a first multiplexer input of the first multiplexer is connected to a first PLL output of the first PLL to transmit a first frequency stabilized timing signal in the direction of the first multiplexer,
wherein a second multiplexer input of the first multiplexer is connected to a second PLL output of the second PLL to transmit a second frequency stabilized timing signal in the direction of the first multiplexer,
wherein the first changeover signal is provided to be used to control the first multiplexer such that depending on a state of the changeover signal the first multiplexer can be used to forward either the first frequency stabilized timing signal or the second frequency stabilized timing signal to the first clock,
wherein the first clock is configured so as, depending on the state of the changeover signal, to process either the first frequency stabilized timing signal or the second frequency stabilized timing signal to generate the first clock signal,
wherein the first changeover signal transmission unit is configured to use a time message transmission unit to perform a change of state of the first changeover signal when a predefined first changeover time stipulated by the time message transmission unit is present, and
wherein the checking apparatus is configured to be prompted, by the change of state of the first changeover signal, to trigger:
forwarding of the second frequency-stabilized timing signal to the first clock via the first timing signal line being aborted at the first changeover time by means of the first multiplexer, and
forwarding of the first frequency-stabilized timing signal to the first clock via the first timing signal line being effected at the first changeover time, and
wherein the checking apparatus is further configured to, at a later time than the first changeover time, ascertain a first time difference such that:
a predefined first global clock comparison time, which follows the first changeover time on the global time scale, is selected as a minuend,
a first local clock comparison time, which is present at the same time as the first global clock comparison time and is associated with the first local time scale, is selected as a subtrahend,
the first time difference obtained from the minuend and the subtrahend reflects the interval of time between the global starting time and the first local starting time, and
the first time difference is subsequently provided for further use in the checking apparatus and/or for use in a further checking apparatus.

8. The checking apparatus as claimed in claim 7, wherein:
said ascertained first time difference, and/or
the first clock signal, is/are transmitted to the first computation unit and/or to the first input/output.

9. The checking apparatus as claimed in claim 7, wherein the first computation unit and/or the first input/output unit is configured to link the first clock signal to calculated data of the first computation unit and/or to data that have been received via the input/output interfaces of the first input/output unit.

10. A composite system comprising at least a first checking apparatus as claimed in claim 7 and a second checking apparatus as claimed in claim 7, wherein the first checking apparatus and the second checking apparatus are connected via a data transmission means, and the first checking apparatus and the second checking apparatus are configured via the data transmission means to perform one or more of:
transmitting data calculated by means of the first computation unit,
transmitting measurement data captured by means of input/output interfaces, or
transmitting the first time difference from the first checking apparatus to the second checking apparatus.

11. The checking apparatus as claimed in claim 7, wherein said ascertaining of the first time difference is triggered by a second changeover signal output by a second changeover signal transmission unit.

12. The checking apparatus as claimed in claim 7, wherein the checking apparatus is connected to said further checking apparatus via data connection means, and wherein the further checking apparatus is an identical equivalent of the checking apparatus.

13. The checking apparatus as claimed in claim 7, wherein the first time difference is used in calculations of the first computation unit to:
convert an arbitrary time, chronologically following the first global clock comparison time, on the global time scale into an associated time of the first local time scale, or
convert an arbitrary time, chronologically following the first global clock comparison time, on the local time scale into an associated time of the global time scale.

* * * * *